United States Patent
Nguyen et al.

(10) Patent No.: US 9,665,385 B1
(45) Date of Patent: May 30, 2017

(54) METHOD AND APPARATUS FOR SIMULATION STORAGE SHELVES

(71) Applicant: EMC CORPORATION, Hopkinton, MA (US)

(72) Inventors: Vy Nguyen, Pleasanton, CA (US); Yiqiang Ding, San Jose, CA (US); Venkata Ratnam Tatavarty, Sunnyvale, CA (US); Zhongjie Wu, Beijing (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 334 days.

(21) Appl. No.: 13/827,385

(22) Filed: Mar. 14, 2013

(51) Int. Cl.
```
G06F 9/455        (2006.01)
G06F 12/1081      (2016.01)
G06F 13/10        (2006.01)
G05B 13/04        (2006.01)
```

(52) U.S. Cl.
CPC .................... *G06F 9/455* (2013.01)

(58) Field of Classification Search
CPC .. G06F 17/5009; G06F 9/455; G06F 12/1081; G06F 13/10; G06F 3/067; H04L 41/0813; H04L 41/0866; G05B 13/04; H04B 17/0095
USPC ............................................... 703/13, 20, 21
See application file for complete search history.

(56) References Cited

U.S. PATENT DOCUMENTS

| | | | | |
|---|---|---|---|---|
| 5,778,411 A | * | 7/1998 | DeMoss | G06F 3/0607 710/68 |
| 8,880,687 B1 | * | 11/2014 | Chandrachari | H04L 41/0816 709/224 |
| 2007/0250302 A1 | * | 10/2007 | Xu | G06F 11/261 703/20 |
| 2011/0231172 A1 | * | 9/2011 | Gold | G06F 11/3433 703/13 |
| 2012/0197624 A1 | * | 8/2012 | Hawargi | G06F 3/0604 703/21 |

* cited by examiner

*Primary Examiner* — Omar Fernandez Rivas
*Assistant Examiner* — Shiuh-Huei Ku
(74) *Attorney, Agent, or Firm* — Blakely, Sokoloff, Taylor & Zafman LLP

(57) ABSTRACT

A storage system for simulation virtual shelves with physical storage shelves is disclosed. The storage system contains a management daemon configured to perform tasks relating to one or more virtual shelves in response to a request for a simulation test, where each physical storage shelf having one or more physical disks. It contains a simulation daemon providing a virtual shelf configuration information to the management daemon when the management daemon interacts with the one or more virtual shelves in response to the request. The storage system also contains a disk driver configured to interface the physical storage shelves with the management daemon. It further contains a simulation driver configured to, in response to the request for a simulation test, process instructions to and from the disk driver and the simulation daemon to simulate access to the one or more virtual shelves, without having to utilize multiple physical storage shelves.

21 Claims, 6 Drawing Sheets

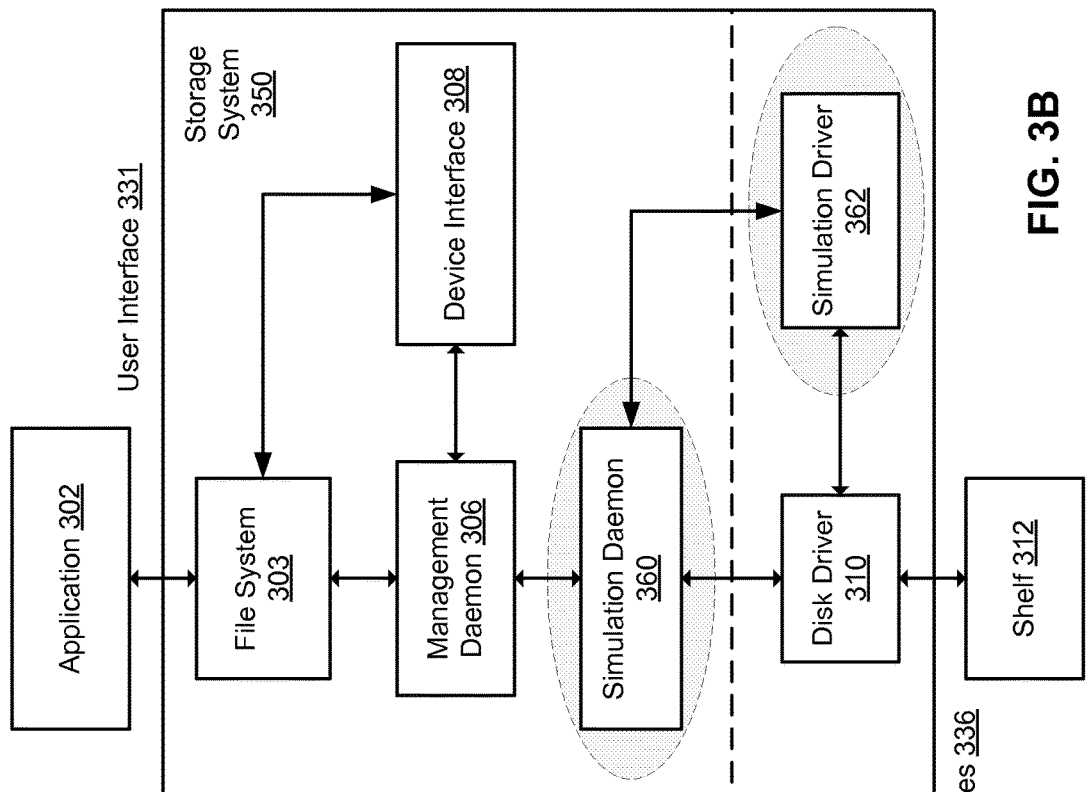
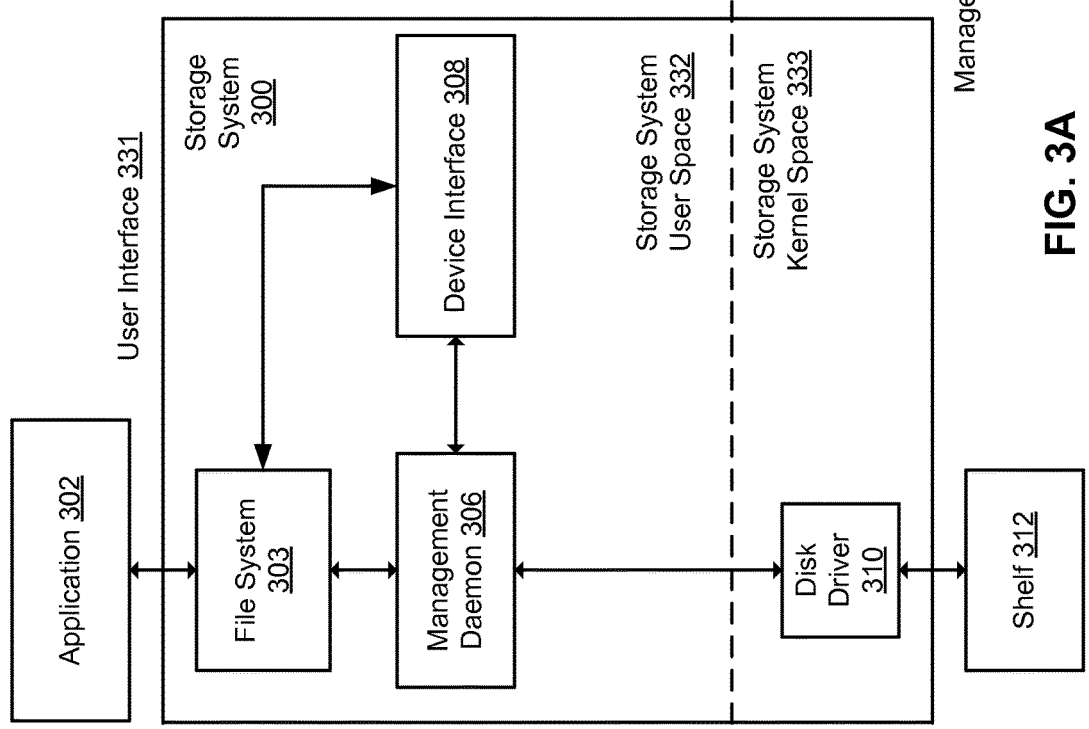
FIG. 3B
FIG. 3A

METHOD AND APPARATUS FOR SIMULATION STORAGE SHELVES

FIELD OF THE INVENTION

Embodiments of the present invention relate generally to data storage systems. More particularly, embodiments of the invention relate to simulation of storage shelves.

BACKGROUND

Data storage is a critical component for computing. In a computing device, there is a storage area in the system to store data for access by the operating system and applications. In a distributed environment, additional data storage may be a separate device that the computing device has access to for regular operations. This kind of data storage is generally referred to as a primary storage, in contrast with a secondary storage, where computing devices also have access to but generally used for backing up. For data protection purposes, regular copies of data are made from a primary storage to a secondary storage. With ever increasing storage demands, additional storage areas, primary storages, second storages, and other storages (collectively referred to as storage systems herein after) have to be added constantly to computing devices and distributed computing/network systems.

For assembly easiness, storage units of primary and secondary storages are often modulated to mountable units referred to as storage shelves. In many storage systems, additional storage shelves are added as demands exhaust capacity of current storage shelves. In fact, aggregation of storage shelves are becoming ubiquitous and it is not uncommon for a storage system to support tens or even hundreds of storage shelves. Deploying storage shelves in a large scale requires testing and measurement of performance before these shelves are put in a production network carrying often mission critical data. Yet, having tens or even hundreds of storage shelves for testing and measurement purpose is impractical and even wasteful in many cases. Similarly, in some application, storage shelves with large volumes of disk space are deployed. For example, a storage shelf may be able to storage up to terabytes or even petabytes. It may not be the most effective way to test and measure such storage shelf by storing data at the storage shelf to its limit when a test needs to be done. A quicker, more economical way to test and measure performance of a storage system in a test environment is needed, when the storage system in a production network is required to manage a large amount of stored data.

BRIEF DESCRIPTION OF THE DRAWINGS

Embodiments of the invention are illustrated by way of example and not limitation in the figures of the accompanying drawings in which like references indicate similar elements.

FIG. 3A illustrates a work flow of a storage system.

FIG. 3B illustrates a work flow of a storage system enhanced with simulation capability according to one embodiment of the invention.

DETAILED DESCRIPTION

Figure 1B:
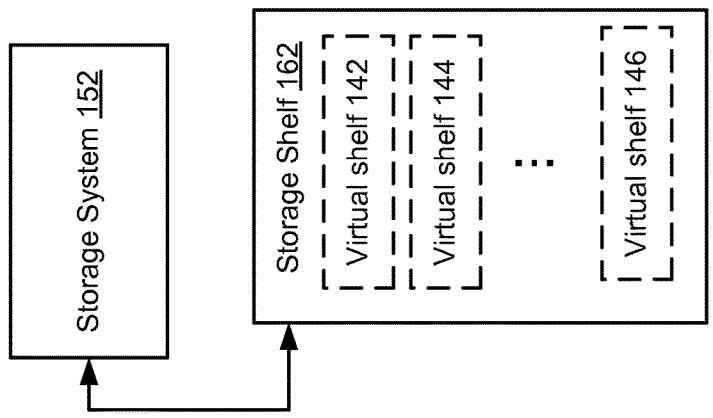
FIG. 1B is a block diagram illustrating a simulation of a storage architecture according to one embodiment of the invention.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment. A dataset is a collection of data that is stored in a storage space in a variety of formats. In some embodiments, a storage space is a sector-based system, where sectors are the basic storage units and a number of sectors make up a data block, or blocks, and a number of blocks make a logical unit (that is identified by a LUN, Logical Unit Number). A storage space may contain a number of logical units. A dataset may be a collection of sectors, blocks, logical units, or a combination thereof.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

According to some embodiments, a storage system for simulation virtual shelves with storage shelf contains a management daemon configured to perform tasks relating to one or more virtual shelves in response to a request for a simulation test of a management and configuration task of the storage system, where the one or more virtual shelves is based on one or more physical disks within one or more physical storage shelves; and a simulation daemon configured to provide a virtual shelf configuration information to the management daemon when the management daemon of the storage system interacts with the one or more virtual shelves, in response to the request for the simulation test of the management and configuration task of the storage system, where the virtual shelf configuration information presents a plurality of virtual shelves based on the one or more physical disks within of the one or more physical storage shelves. The storage system further contains a disk driver configured to interface the one or more physical storage shelves with the management daemon and a simulation driver configure to, in response to the request for the simulation test of the management and configuration task of the storage system, process instructions to and from the disk driver and the simulation daemon to simulate access to the one or more virtual shelves, without having to utilize multiple physical storage shelves. Thus, when a simulation test (e.g., performance evaluation) is initiated, the simulation daemon and its corresponding simulation driver are activated. The simulation daemon and the simulation driver work with each other to provide a logical view of multiple virtual storage shelves using one or more disks of a single physical storage shelf. As a result, the simulation test can be performed using fewer storage resources (and without significantly impacting the ordinary operations of the physical storage shelves). From an application's point of view (e.g., simulation test application), the logical or virtual storage shelves appear as physical storage shelves.

According to some embodiments, a method of simulating one or more virtual shelves based on one or more storage shelves is disclosed. The method starts with receiving a request at a management daemon of a storage system for a simulation test of a management and configuration task, the management daemon then interacts with one or more virtual shelves in response to the request for the simulation test of the management and configuration task of the storage system, wherein the management daemon performs tasks relating to the one or more virtual shelves, wherein the one or more virtual shelves is based on the one or more physical disks within one or more physical storage shelves, and it continues with providing a virtual shelf configuration information through a simulation daemon to the management daemon of the storage system when the management daemon of the storage system interacts with the one or more storage shelves in response to the request for simulation test of the management and configuration task of the storage system, wherein the virtual shelf configuration information presents a plurality of virtual shelves based on the one or more physical disks within a single one of the physical storage shelves. Then the method processes instructions through a simulation driver to and from a disk driver of the storage system and the simulation daemon to simulate access to the virtual shelves, in response to the request for simulation test of the management and configuration task of the storage system, without having to utilize multiple physical storage shelves.

Figure 1A:
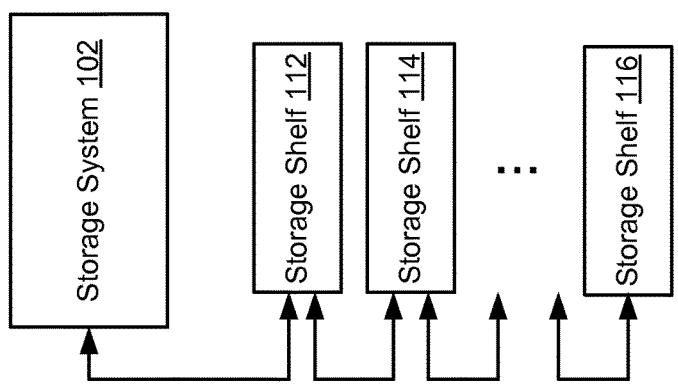
FIG. 1A is a block diagram illustrating a storage architecture.

FIG. 1A is a block diagram illustrating a storage architecture according to one embodiment of prior art. Referring to FIG. 1, storage system 102 may be a backup application server, which coordinates data backup, storage, or replication applications in one embodiment. Storage system 102 may also be a storage appliance, which can be a part of a client of a remote backup storage in another embodiment. A client of a remote backup storage may be any type of hosts such as a server, a personal computer (e.g., desktops, laptops, and tablets), a "thin" client, a personal digital assistant (PDA), a Web enabled system, a gaming device, a media player, or a mobile phone (e.g., Smartphone), etc.

Storage system 102 is communicatively coupled with a number of storage shelves, storage shelves 112-116, which may be physical storage shelves, each having one or more physical storage disks (e.g., redundant array of independent disks or RAID). The coupling may be through an interconnect such as a bus. It may also be through a network such as a local area network (LAN), a wide area network (WAN) such as Internet, a corporate intranet, a metropolitan area network (MAN), a storage area network (SAN), a bus, or a combination thereof, wired and/or wireless.

Storage shelves 112-116 contain storage units or disks. The storage units may be implemented locally (e.g., single node operating environment) or remotely (e.g., multi-node operating environment) via an interconnect, which may be a bus and/or a network. In one embodiment, one of the storage units operates as an active storage to receive and store external or fresh user data, while the other storage unit operates as a target storage unit to periodically archive data from the active storage unit according to an archiving policy or scheme. Storage units may be, for example, conventional magnetic disks, optical disks such as CD-ROM or DVD based storage, magnetic tape storage, magneto-optical (MO) storage media, solid state disks, flash memory based devices, or any other type of non-volatile storage devices suitable for storing large volumes of data. Storage units may also be combinations of such devices. In the case of disk storage media, the storage units may be organized into one or more volumes of Redundant Array of Inexpensive Disks (RAID).

Storage shelves 112-116 may be implemented in any type of server or cluster of servers. For example, a storage shelf may represent a storage server used for any of various different purposes, such as to provide multiple users with access to shared data and/or to back up mission critical data. Also for example, a storage shelf may be a file server (e.g., an appliance used to provide NAS capability), a block-based storage server (e.g., used to provide SAN capability), a unified storage device (e.g., one which combines NAS and SAN capabilities), a nearline storage device, a direct attached storage (DAS) device, a tape backup device, or essentially any other type of data storage device. A storage shelf may have a distributed architecture, or all of its components may be integrated into a single unit. A storage shelf may be implemented as part of an archive and/or backup storage system such as a de-duplication storage system available from EMC® Corporation of Hopkinton, Mass.

In one embodiment, the storage shelves 112-116 may be used as a tier of storage in a storage hierarchy that comprises other tiers of storage. One or more tiers of storage in this hierarchy may utilize different kinds of storage devices and/or may be optimized for different characteristics such as random update performance. Datasets are periodically moved among the tiers based on data management policies to achieve a cost-effective match to the current storage requirements of the datasets. For example, a dataset may initially be stored in a tier of storage that offers high performance for reads and writes. As the dataset ages, it may be moved into a tier of storage according to one embodiment of the invention. In various embodiments, tiers include different storage technologies (e.g., tape, hard drives, semi-conductor-based memories, optical drives, etc.), different locations (e.g., local computer storage, local network storage, remote network storage, distributed storage, cloud storage, archive storage, vault storage, etc.), or any other appropriate storage for a tiered data storage system.

In one embodiment, each of storage shelves 112-116 is communicatively coupled with storage system 102 directly. In another embodiment, storage shelves are communicatively coupled in tandem and some storage shelves communicate with storage system through other storage shelves earlier in a storage shelf chain. In yet another embodiment, storage system 102 and storage shelves 112-116 are integrated together as a single system. In one embodiment, additional shelves are added to when an application at storage system 102 requires additional storage space (e.g., the existing storage space has been exhausted).

In order to measure and test performance of storage system 102 before deploying it in a production setting, a straightforward way is to build such storage architecture in a laboratory setting. In the laboratory setting, the storage architecture can be tested to its limit by adding a maximum allowable storage shelves, and loading a large amount of data to these storage shelves, ideally close to its design limitation and then observe system behaviors.

Yet, such approach has serious drawbacks. A large storage architecture buildup comes with high cost. Nowadays a large storage architecture support s up to tens to hundreds storage shelves. Procuring storage shelves to design limitation can be prohibitively expensive in unit costs. In addition, laboratory space is expensive, and an exact replica of a large storage architecture can take significant laboratory space thus add to the cost. Furthermore, an exact replica of a large storage architecture is expensive to maintain. In a production setting, a team of network operators manages and maintains a large storage architecture. The expenditure is necessary as in a production setting, the storage architecture likely run mission critical applications. In a laboratory setting, the expenditure of having a team of operators for a replica is likely not justified.

A large storage architecture in a laboratory setting can also be counterproductive. For many applications, testing does not focus on consumption of physical storage spaces. For example, a test may be to measure the system's capability of processing commands in bulk, or handing error conditions. In this kind of test, using a replica of a large storage architecture can be very slow. The larger a storage architecture is, the longer it takes for boot-up. The larger a storage architecture is, the harder to switch from one version of software/firmware to another version. Thus, in many cases, an exact replica in a laboratory setting is not only expensive, but also counterproductive.

FIG. 1B is a block diagram illustrating a simulation of a storage architecture according to one embodiment of the invention. The systems/architecture of FIG. 1B is similar to the ones of FIG. 1A, and the same or similar references indicate elements or components having the same or similar functionalities.

In FIG. 1B, instead of setting up an exact replica of a storage architecture in a production setting, a single storage shelf, storage shelf 162, is utilized to simulate a group of virtual shelves, virtual shelves 142-146. Thus, in order to test and measure the performance of storage system 152, only a single physical storage shelf is required. As discussed in more detail herein below, virtual shelves 142-146 may be a portion of storage units of shelf 162. For example, each virtual shelf may take physical disk spaces of sectors, blocks, logic units, or some other types of units for storage.

With the storage architecture illustrated in FIG. 1B, one may test or measure performance of a much larger architecture through simulation. In one embodiment, storage shelf 162 may be used to simulate multiple physical shelves (e.g., 50+ shelves) using virtual shelves 142-146. In another embodiment, storage shelf 162 may be used to simulate one or more physical shelf with much bigger storage space than storage shelf 162 itself. In these simulations, storage system 152 is led to believe that storage shelf 162 is multiple physical shelves and/or one or more shelf with more storage space. Note that simulation has its limitation. For example, a simulation may not be used in an application where the application consumes physical storage space more than storage shelf 162 contains. Simulation with virtual shelf/shelves is useful for functional test, for example, testing and measurement of operations, administration, maintenance, provisioning, and troubleshooting. Simulation environment with a smaller setup is easier and faster to be provisioned and bring to service, comparing to a large setup mimicking a large production setting, and it also can be changed to different configurations quickly. Thus, a simulation environment illustrated in FIG. 1B may offer many advantages for testing and measurement.

Figure 2:
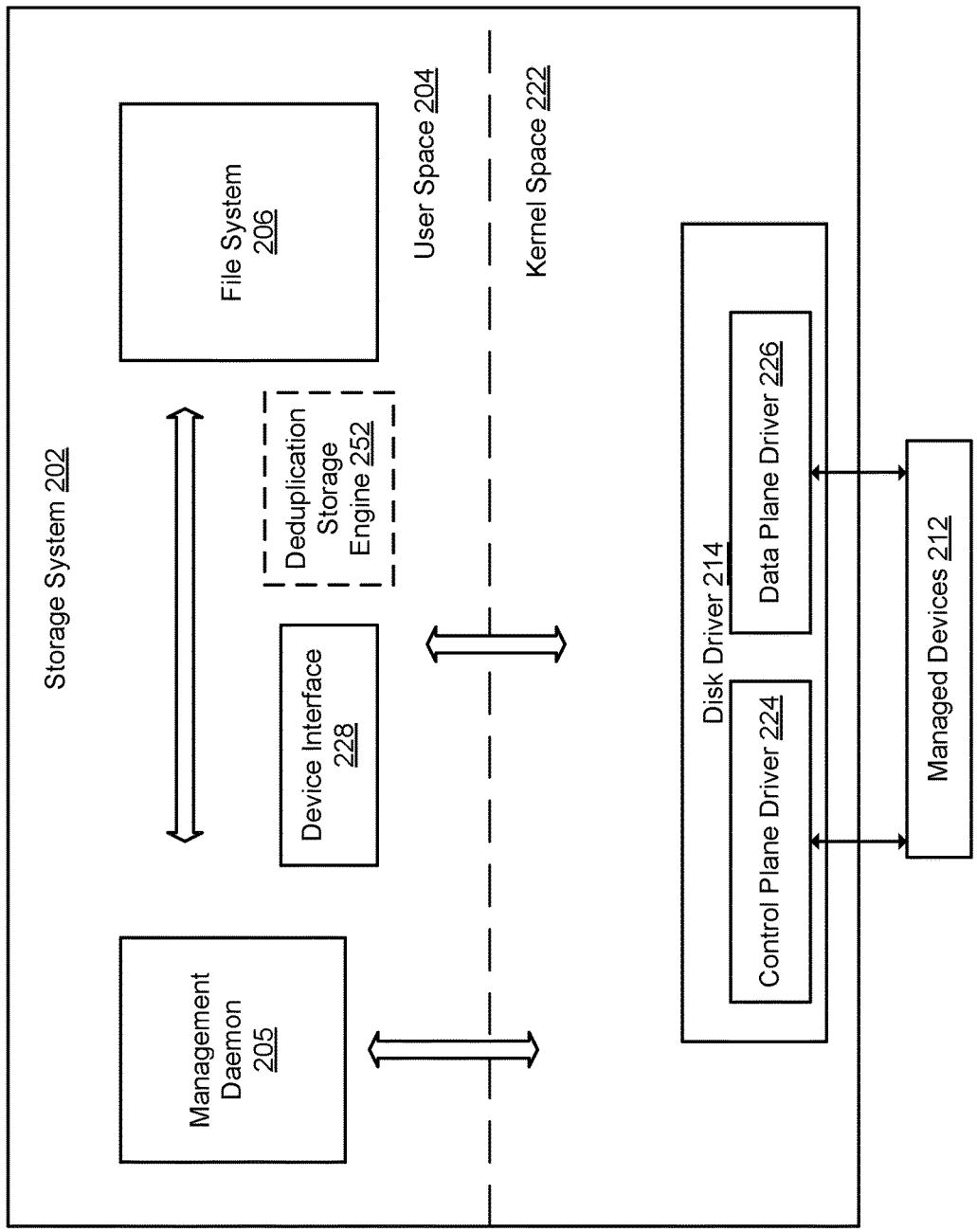
FIG. 2 is a block diagram illustrating a storage system.

FIG. 2 is a block diagram illustrating a storage system according to one embodiment. Storage system 202 logically contains a user space and a kernel space, user space 204 and kernel space 222, respectively. A conventional computer operating system usually segregates virtual memory into a kernel space and a user space. Kernel space is strictly reserved for running the kernel, kernel extensions, and most device drivers. In contrast, user space is the memory area where all user mode applications work and this memory can be swapped out when necessary.

User space 204 may be the space where user applications are stored and ran to help users to perform one or more specific tasks. Within user space 204, management daemon 205 interacts with file system 206 and entities within kernel space 222 to coordinate configuring storage system 202 for applications requested from user applications. File system 206 manages access to data and metadata of files and it may also manage spaces for storing the files. File system 206 may also act as clients for protocols and applications supported by storage system 202. User space 204 may also contain device interface 228, which is configured to provide accesses to disk drivers for applications in user space 204. Note management daemon 205 may interact with a library (e.g., dynamic-link library in Microsoft Windows® platform or dynamic linker model in GNU/Linux systems) in run time to obtain storage shelf information.

In addition, optionally, there is a deduplication storage engine 252 that may reside within user space 204. The deduplication storage engine is configured to segment the data file into multiple chunks (also referred to as segments) according to a variety of segmentation policies or rules. Deduplication storage engine may choose not to store a chunk in a storage unit if the chunk has been previously stored in the storage unit. In the event that deduplication storage engine chooses not to store the chunk in the storage unit, it stores metadata enabling the reconstruction of the file using the previously stored chunk. As a result, chunks of data files are stored in a deduplicated manner in managed devices 212. The metadata may be stored in at least some of storage devices 212, such that files can be accessed independent of another storage unit. Metadata of each storage unit includes enough information to provide access to the files it contains.

Kernel space 222 bridges applications in user space 204 with managed devices 212 (e.g., storage shelves). Kernel space 222 provides low level abstraction layer for resources that applications in user space 204 need to perform their functions. Kernel space 222 contain disk driver 214, which interacts with device interface 228 to provide applications of user space 204 access to managed devices 212. Disk driver 214 can be logically separated into two categories, control plane driver 224 and data plane driver 226. Intuitively, control plane driver 224 is for signaling and coordination between storage system 202 and the managed devices 212 (e.g., storage shelves), while data plane driver 226 is for storage data passing between storage 202 and the managed devices 212. In some embodiments of the invention, simulation for control plane is more prevalent than one for data plane. The reason is that performance of data processing via the data plane of storage system 202 to the data plane of one physical storage shelf may be significantly different from a data plane interaction between storage system 202 to a number of physical storage shelves. Thus, in some embodiments, control plane driver 224 and data plane driver 226 are considered differently in simulation. Note FIG. 2 illustrates only components and entities of a storage system essential to embodiments of the invention for simplicity of illustration, and other components, entities, programs, and/or applications are required for proper operations and interactions with users and managed devices of the storage system.

FIG. 3A illustrates a work flow of a storage system according to one embodiment. Storage system 300 is similar to storage system 202 and the same or similar references indicate elements or components having the same or similar functionalities. Storage system 300 contains storage system user space 332 and kernel space 333. The storage system interacts with application 302 through user interface 331. Application 302 requests services of file system 303 through an application programming interface (API). File system 303 in turn interacts with device interface 308 for access of data and metadata of files, including files stored in managed devices 346 (e.g., shelf 312). File system 303 also interacts management daemon 306, which coordinates configuration of managed devices 346 required by application 302, among other tasks. The configuration of managed devices goes through disk driver 310, which interacts with managed devices 336 for physical access. Note that shelf 312 is an example of managed devices 336. Multiple shelves, and shelves of different types and storage characteristics can also be communicatively coupled with storage system 300. Also, in some embodiments, for example, when a storage system is a storage appliance, managed devices 336 may be integrated with storage system 300 as a single system. In FIG. 3A, testing and measurement of storage system 300 interacting with managed devices 336 is limited to physical devices communicatively coupled with storage system 300. As discussed herein above, this kind of test environment can be both expensive and counterproductive.

FIG. 3B illustrates a work flow of a storage system enhanced with simulation capability according to one embodiment of the invention. Storage system 350 is similar to storage system 300 and the same or similar references indicate elements or components having the same or similar functionalities. The difference includes added simulation daemon 360 and simulation driver 362.

Simulation daemon 360 is an entity outside of management daemon 306. In other words, in embodiments of the invention, the binary and executable of management daemon 306 is intact, thus the integrity of management daemon 306 is maintained to ensure authenticity of simulation. Simulation daemon 306 monitors interactions between management daemon 306 and disk driver 310. When an interaction between management daemon 306 and disk driver 310 requires information relating to shelf configuration information (e.g., capacity, configuration, disk status, shelf management state of shelf 312), simulation daemon 360 replaces the shelf configuration information of the shelf physically coupled to storage system 350 with information of a virtual shelf configuration. Thus, from the view of management daemon 306, the shelf under management is not shelf 312; rather, it is what is characterized in the information of the virtual shelf configuration. In one embodiment, simulation daemon 360 adds a file containing virtual shelf configuration information on the search path of management daemon 306, thus when management daemon 306 searches for shelf configuration information, the file containing virtual shelf configuration information is located (instead of the file containing physical shelf configuration information of shelf 312). In one embodiment, the search path of the management daemon for a dynamic library is modified so that the virtual shelf configuration information of the simulation daemon takes priority.

Since management daemon 306 has a logical view of managed devices 336 (thus shelf 312 is one or more virtual shelves characterized by the information of the virtual shelf configuration as seen by management daemon 306), its requests and commands to the one or more virtual shelves may not be able to be fulfilled through disk driver 310. Simulation driver 362 is added to accommodate interaction to disk driver 310 relating to shelf configuration information. Simulation driver 362 interacts with simulation daemon 360 to ensure that management daemon 306 is given a simulated view. The simulated view is presented through virtual shelf configuration information, which is configured and updated by an operator of testing and measurement environment of storage system 350. Note simulation daemon 360 and simulation driver 362 may be a part of a processor of storage system 350 in one embodiment. In another embodiment, simulation daemon 360 and simulation driver 362 may have their dedicated processor units or general purpose processors.

Through simulation daemon 360 and simulation driver 362, shelf 312 can be used to simulation a practically limitless variety of storage architectures. The virtual shelf configuration information may be provided such that shelf 312 is viewed as a shelf with a much larger storage space than shelf 312 possesses. Shelf 312 may also be viewed as an aggregation of shelves by applications in user space 332. In other words, shelf 312 may be used to test and measure performance of management daemon 306 and other user applications in a configuration much more complicated and also departed from configuration of the physical storage shelf 312.

In addition, through simulation daemon 360 and simulation driver 362, error can be injected on the set of virtual shelves, so that from the view of management daemon 306, it interacts with the set of shelves with errors, thus an operator may test how management daemon 306 performs one or more management and configuration task under normal and error scenarios. Furthermore, through simulation daemon 360 and simulation driver 362, an operator may update configuration information of the set of virtual shelves without changing any physical storage shelves, on which the set of virtual shelves are based on. For example, it can be a major saving on test time when the operator does not have to reboot the physical storage shelves after changing configuration.

The storage system 350 enhanced with simulation capability is useful in a variety of ways. As discussed herein above, the simulation now can be used to test and measure performance of storage system 350 interacting with a large number of storage shelves or one or more storage shelves with large storage spaces, through limited capital investment in storage shelf and laboratory space, and limited operational cost of human resources in maintenance and management of the storage system. In addition, the simulation environment illustrated FIG. 3B is more efficient. For example, it can be much faster to bring up the simulation environment with less/smaller storage shelves than a storage system in a production setting. It is also much easier to switch from one version of software/firmware to another in the simulation environment. Furthermore, in order to test a storage system behavior in a configuration, an operator can change virtual shelf configuration information through changing only configuration files, it is not constrained by what hardware is available in a laboratory setting and when. Note it is not meant to enumerate here all benefits of using virtual storage shelves to simulate physical storage shelf for testing and measurement of performance of a storage system. Person skilled in the art can recognize other benefits provided by the simulation methods disclosed herein. Systems 300 and 350 may further include a deduplication storage engine (not shown) to deduplicate data to be stored in shelf 312.

Figure 4:
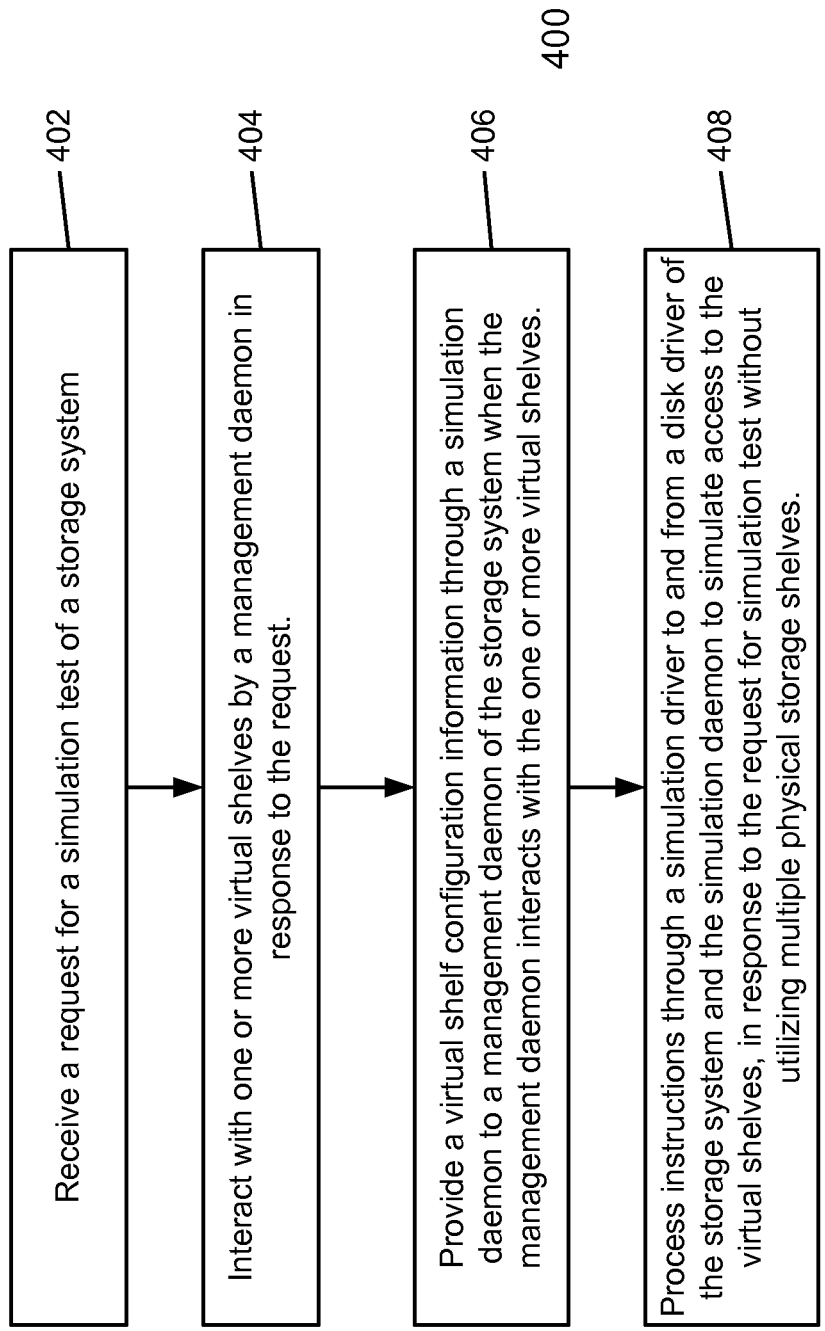
FIG. 4 is a flow diagram illustrating a method of simulating one or more virtual shelves based on one or more storage shelves according to one embodiment of the invention.

FIG. 4 is a flow diagram illustrating a method of simulating one or more virtual shelves based on one or more storage shelves according to one embodiment of the invention. Method 400 may be implemented in storage system 350 of FIG. 3.

Referring to FIG. 4, the method starts with receiving a request for a simulation test of a storage system at reference 402. The simulation test is for simulating management and configuration task in one embodiment. The request may come from a user application external to the storage system. The request may also come from an internal request within the storage system (e.g., a function call of a process within the storage system). The storage system is a backup application server in one embodiment; in an alternate embodiment, the storage system is a storage appliance (e.g., hosts as discussed herein above).

Then a management daemon of the storage system interacts with one or more virtual shelves in response to the request for the simulation test. The management daemon performs tasks relating to the one or more virtual shelves, where the one or more virtual shelves is based on the one or more physical disks within one or more physical shelves.

Onward to reference 406, a virtual shelf configuration information is provided to the management daemon of the storage system through a simulation daemon when the management daemon of the storage system interacts with the one or more virtual shelves in response to the request for a simulation test. The virtual shelf configuration information presents a number of virtual shelves based on the one or more physical disks within a single one of the physical storage shelves. The simulation daemon may be implemented in a processor shared with the management daemon, but it contains binary and executable separate from the management daemon. In one embodiment, simulation daemon adds a file including virtual shelf configuration information in the search path of the management daemon so that the management daemon finds the virtual shelf configuration information when it looks for physical shelf configuration information of one or more physical shelves communicatively coupled with the storage system. In one embodiment, the search path of the management daemon for a dynamic library is modified so that the virtual shelf configuration information of the simulation daemon takes priority.

Then at reference 408, instructions to and from a disk driver of the storage system and the simulation daemon to simulate access to the virtual shelves is processed through a simulation driver in response to the request for a simulation test. The disk driver directly interacts with physical storage shelf or shelves communicatively coupled with the storage system, and the simulation driver facilitates the interaction using the virtual shelf configuration information without having to utilize multiple physical storage shelves.

Figure 5:
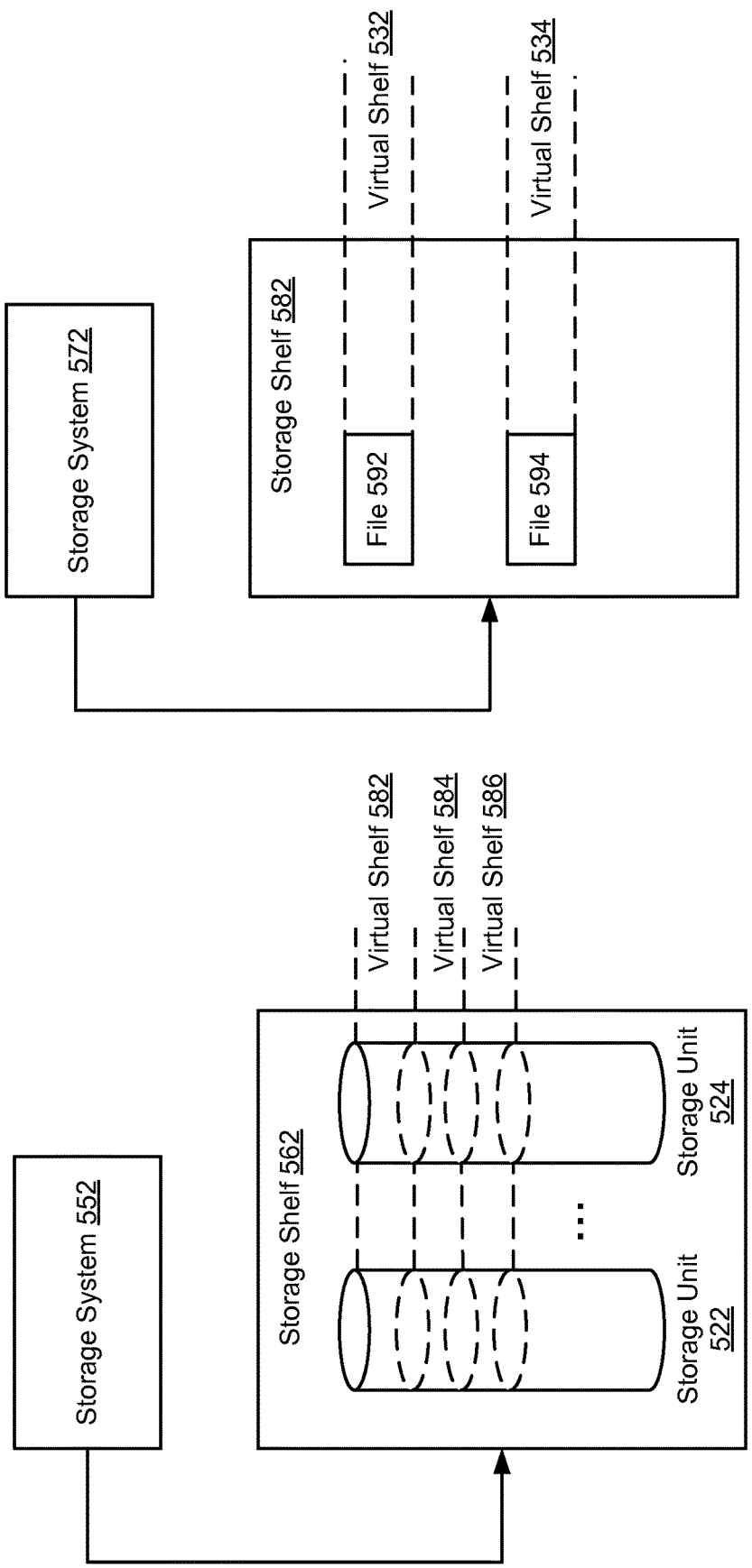
FIG. 5A illustrates simulating multiple virtual shelves using a single storage shelf according to an embodiment of the invention.
FIG. 5B illustrates simulating multiple virtual shelves using files of storage shelf/shelves according to an embodiment of the invention.

FIGS. 5A-B illustrate simulating virtual shelves using a storage shelf according to embodiments of the invention. Using a simulation daemon, an operator of a storage system may simulate a variety of storage shelf configurations by manipulating virtual shelf configuration information that the simulation daemon feeds to a management daemon of the storage system. Two examples of embodiments of the inventions are highlighted below. These embodiments are for illustration only, and those skilled in the art will recognize the underlying principle and apply it to other embodiments.

FIG. 5A illustrates simulating multiple virtual shelves using a single storage shelf according to an embodiment of the invention. Storage system 552 manages a single storage shelf 562. Through simulation daemon and simulation driver (not shown) within storage system 552, storage system 552 views storage shelf 562 as a chain of storage shelves, e.g., virtual shelves 582-586. Storage shelf 562 contains multiple storage units, storage units 522 to 524. A virtual shelf configuration information is generated such that a slice of each storage unit or disk (e.g., part of RAID) is considered a virtual shelf. Thus virtual shelves 582-586 utilize slices of storage shelf 562 to simulate multiple shelves communicatively couple to storage system 552.

With virtual shelf configuration information corresponding to virtual shelves 582-586, testing and measurement of performance of storage system 552 can be performed in a compact scale. While applications utilizing virtual shelves 582-586 cannot consume more than a physical storage space of each slice of storage shelf 562, testing these applications is not relating to physical storage consumption in many cases. Using smaller storage space for each virtual shelf also has the benefit of filling up to storage capacity quickly thus allows test to run under capacity constraints quickly.

FIG. 5B illustrates simulating multiple virtual shelves using files of storage shelf/shelves according to an embodiment of the invention. Storage system 572 and storage shelf 582 are similar to storage system 552 and storage shelf 562 respectively. In FIG. 5B, files are used to simulate virtual shelves. That is, virtual shelf configuration information is generated such that a file within a physical storage shelf is considered a virtual shelf. For example, a file with kilobytes of data can be designated as a storage space of a virtual shelf up to terabytes. Files 592 and 594 are sparse files in storage shelf 582, and they are designated as virtual shelves 532 and 534 respectively in the virtual shelf configuration information utilized by a simulation daemon of storage system 572. The virtual shelf configuration information is fed to the management daemon of storage system 572. Thus from the management daemon's view, it interacts with virtual shelf 532 and 534 directly.

With virtual shelf configuration information being configurable by an operator of a storage system for simulation, a physical storage shelf may be used to simulate other configuration scenarios. For example, the virtual shelf configuration information may be configured to simulate a virtual shelf with much a larger storage space than the storage shelf the virtual shelf is based on. Similarly, a smaller file of the storage shelf can simulate a much larger virtual file within the same storage shelf.

Figure 6:
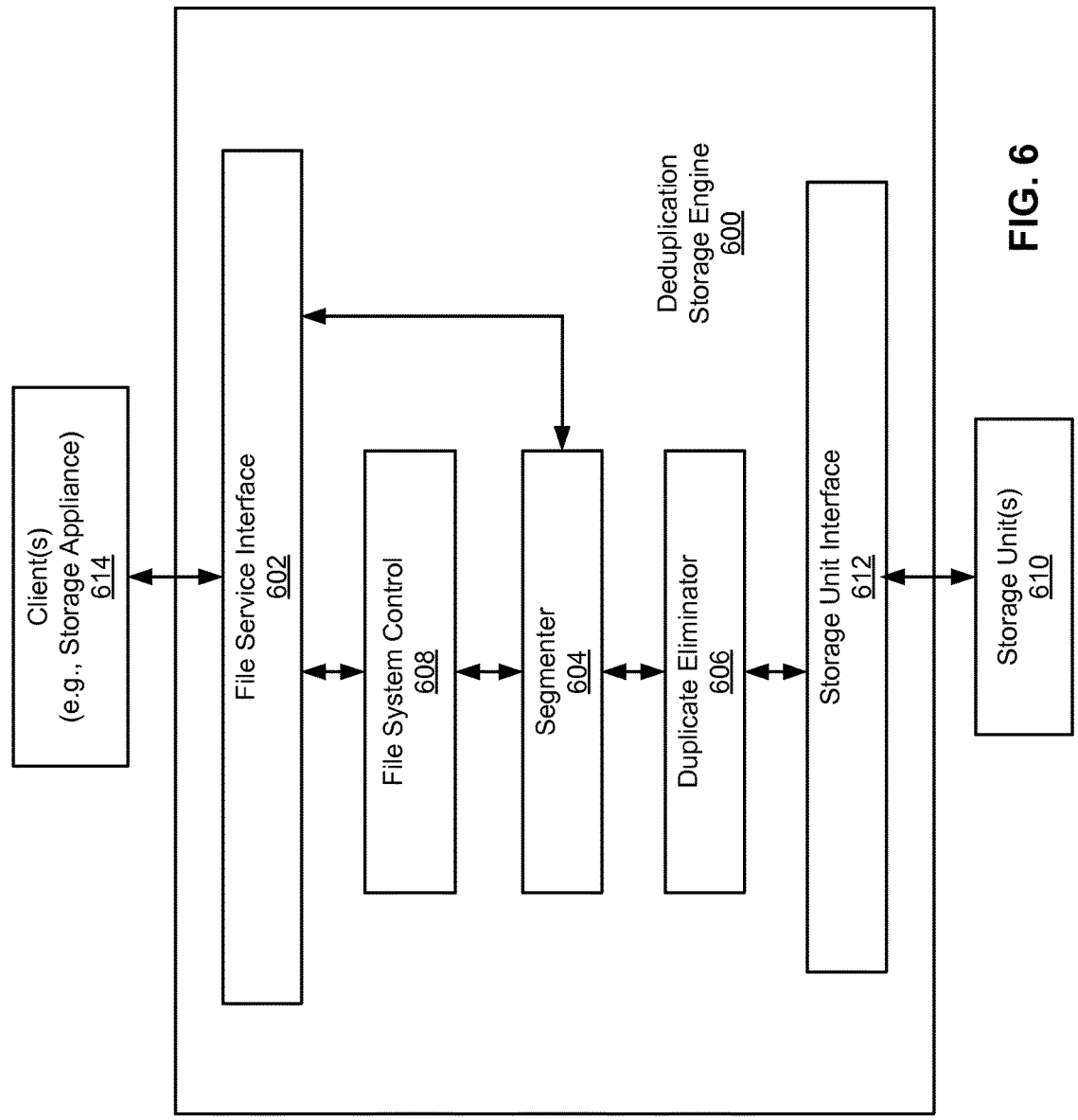
FIG. 6 is a block diagram illustrating a segment storage engine according to one embodiment of the invention.

FIG. 6 is a block diagram illustrating a segment storage engine according to one embodiment of the invention. Both storage system and storage shelf of the storage architectures discussed herein above (e.g., FIGS. 3A-B) may be a part of a deduplicating storage system. Referring to FIG. 6, in one embodiment, deduplication storage engine 600 includes file service interface 602, segmenter 604, duplicate eliminator 606, file system control 608, and storage unit interface 612. Deduplication storage engine 600 receives a file or files (or dataset(s)) for a user application via file service interface 602, which may be part of a file system namespace of a file system associated with the deduplication storage engine 600. The file system namespace refers to the way files are identified and organized in the system. An example is to organize the files hierarchically into directories or folders. File service interface 602 supports a variety of protocols, including a network file system (NFS), a common Internet file system (CIFS), and a virtual tape library interface (VTL), etc.

The file(s) is/are processed by segmenter 604 and file system control 608. Segmenter 604 breaks the file(s) into variable-length segments based on a variety of rules or considerations. For example, the file(s) may be broken into segments by identifying segment boundaries using a content-based technique (e.g., a function is calculated at various locations of a file, when the function is equal to a value or when the value is a minimum, a maximum, or other value relative to other function values calculated for the file), a non-content-based technique (e.g., based on size of the segment), or any other appropriate technique. In one embodiment, a segment is restricted to a minimum and/or maximum length, to a minimum or maximum number of segments per file, or any other appropriate limitation.

In one embodiment, file system control 608 processes information to indicate the segment(s) association with a file. In some embodiments, a list of fingerprints is used to indicate segment(s) associated with a file. File system control 608 passes segment association information (e.g., representative data such as a fingerprint) to an index (not shown). The index is used to locate stored segments in storage units 610 via storage unit interface 612. Duplicate eliminator 606 identifies whether a newly received segment has already been stored in storage units 610. In the event that a segment has already been stored in storage unit(s), a reference to the previously stored segment is stored, for example, in a segment tree associated with the file, instead of storing the newly received segment. A segment tree of a file may include one or more nodes and each node represents or references one of the deduplicated segments stored in storage units 610 that make up the file. Segments are then packed by a container manager (not shown) into one or more storage containers stored in storage units 610. The deduplicated segments may be further compressed using a variation of compression algorithms, such as a Lempel-Ziv algorithm before being stored.

When a file is to be retrieved, file service interface 602 is configured to communicate with file system control 608 to identify appropriate segments stored in storage units 610 via storage unit interface 612. Storage unit interface 612 may be implemented as part of a container manager. File system control 608 communicates with an index (not shown) to locate appropriate segments stored in storage units via storage unit interface 612. Appropriate segments are retrieved from the associated containers via the container manager and are used to construct the requested file. The file is provided via interface 602 in response to the request. In one embodiment, file system control 608 utilizes a tree (e.g., a segment tree) of content-based identifiers (e.g., fingerprints) to associate a file with data segments and their locations in storage unit(s). In the event that a segment associated with a given file or file changes, the content-based identifiers will change and the changes will ripple from the bottom to the top of the tree associated with the file efficiently since the appropriate content-based identifiers are easily identified using the tree structure.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the invention also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

The invention claimed is:

1. A storage system, comprising:
 a processor and non-transitory computer-readable storage medium coupled to the processor, wherein the non-transitory computer-readable storage medium contains instructions executable by the processor, wherein the instructions include:
 a management daemon running within a user space of an operating system to perform tasks relating to one or more virtual shelves in response to a request for a simulation test of a management and configuration task of the storage system, wherein the one or more virtual shelves use one or more physical disks within one or more physical storage shelves;

a simulation daemon running within the user space of the operating system to provide a virtual shelf configuration information to the management daemon when the management daemon of the storage system interacts with the one or more virtual shelves, in response to the request for the simulation test of the management and configuration task of the storage system, wherein the virtual shelf configuration information presents a plurality of virtual shelves based on the one or more physical disks within of the one or more physical storage shelves;

a disk driver running within a kernel space of the operating system to interface the one or more physical storage shelves with the management daemon, the disk driver including a logical control plane driver representing a control plane of the storage system and a logical data plane driver representing a data plane of the storage system, wherein the logical control plane driver is for signaling and coordination between the storage system and the one or more physical storage shelves and the logical data plane driver is for storage data passing between the storage system and the one or more physical storage shelves, wherein the request for the simulation test is to test functionality of the control plane of the storage system without storing data to the physical disks via the data plane; and a simulation driver running within the kernel space of the operating system to, in response to the request for the simulation test of the management and configuration task of the storage system, process instructions to and from the disk driver, and interact with the simulation daemon to simulate access to the one or more virtual shelves for providing shelf configuration information of the virtual shelves to the management daemon, without having to utilize additional physical storage shelves, wherein the virtual shelves are presented to the simulation daemon by the simulation driver to have a virtual storage capacity that is larger than a physical storage capacity of the physical disks of the physical shelves, wherein the storage system logically contains the user space of the operating system and the kernel space of the operating system.

2. The storage system of claim 1, wherein the storage system is one of a backup application server and a backup storage appliance.

3. The storage system of claim 1, wherein the virtual shelf configuration information simulates a plurality of virtual shelves based on a physical storage shelf.

4. The storage system of claim 3, wherein a portion of the physical storage shelf is designated as a virtual shelf specified in the virtual shelf configuration information.

5. The storage system of claim 1, wherein the virtual shelf configuration information simulates a virtual shelf with a larger storage space than a physical storage shelf the virtual shelf based on.

6. The storage system of claim 1, wherein the virtual shelf configuration information simulates a first file based on a second file within a physical storage shelf, wherein the size of the first file is larger than the size of the second file.

7. The storage system of claim 1, wherein a search path of the management daemon for a dynamic library is modified so that the virtual shelf configuration information of the simulation daemon takes priority in response to the request for a simulation test of a management and configuration task.

8. The storage system of claim 1, wherein the one or more physical storage shelves are deduplicating storage systems.

9. The storage system of claim 1, wherein the simulation daemon is configured to inject errors on the one or more virtual shelves.

10. The storage system of claim 1, wherein the simulation daemon is configured to provide an updated virtual shelf configuration information to the management daemon without changing the one or more physical storage shelves.

11. A method of simulating one or more virtual shelves based on one or more physical storage shelves, the method comprising:

receiving, in a storage system, a request for a simulation test of a management and configuration task of the storage system, wherein the storage system logically contains a user space of an operating system and a kernel space of the operating system;

interacting with one or more virtual shelves by a management daemon running within the user space of the operating system in the storage system in response to the request for the simulation test of the management and configuration task of the storage system, wherein the management daemon performs tasks relating to the one or more virtual shelves, and wherein the one or more virtual shelves use one or more physical disks within one or more physical storage shelves;

providing a virtual shelf configuration information through a simulation daemon running within the user space of the operating system in the storage system to the management daemon of the storage system when the management daemon of the storage system interacts with the one or more virtual shelves in response to the request for simulation test of the management and configuration task of the storage system, wherein the virtual shelf configuration information presents a plurality of virtual shelves based on the one or more physical disks within a single one of the physical storage shelves; and processing instructions through a simulation driver running within the kernel space of the operating system in the storage system to and from a disk driver running within the kernel space of the operating system of the storage system and the simulation driver interacting with the simulation daemon to simulate access to the virtual shelves for providing shelf configuration information to the management daemon, in response to the request for simulation test of the management and configuration task of the storage system, without having to utilize additional physical storage shelves, the disk driver including a logical control plane driver representing a control plane of the storage system and a logical data plane driver representing a data plane of the storage system, wherein the logical control plane driver is for signaling and coordination between the storage system and the one or more physical storage shelves and the logical data plane driver is for storage data passing between the storage system and the one or more physical storage shelves, wherein the request for the simulation test is to test functionality of the control plane of the storage system without storing data to the physical disks via the data plane, wherein the virtual shelves are presented to the simulation daemon by the simulation driver to have a virtual storage capacity that is larger than a physical storage capacity of the physical disks of the physical shelves.

12. The method of claim 11, wherein the virtual shelf configuration information simulates a plurality of virtual shelves based on the one or more physical storage shelves.

13. The method of claim 11, wherein the virtual shelf configuration information simulates a virtual shelf with a larger storage space than the one or more physical storage shelves the virtual shelf based on.

14. The method of claim 11, wherein the virtual shelf configuration information simulates a first file within a virtual shelf based on a second file within a physical storage shelf, wherein the size of the first file is larger than the size of the second file.

15. The method of claim 11, wherein a search path of the management daemon for a dynamic library is modified so that the virtual shelf configuration information of the simulation daemon takes priority.

16. A non-transitory computer-readable storage medium having instructions stored therein, which when executed by a processor, cause the processor to perform a method of simulating one or more virtual shelves based on one or more physical storage shelves, the method comprising:

receiving, in a storage system, a request for a simulation test of a management and configuration task of the storage system, wherein the storage system logically contains a user space of an operating system and a kernel space of the operating system;

interacting with one or more virtual shelves by a management daemon running within the user space of the operating system in the storage system in response to the request for simulation test of the storage system, wherein the management daemon performs tasks relating to one or more virtual shelves, and wherein the one or more virtual shelves use one or more physical disks within one or more physical storage shelves;

providing a virtual shelf configuration information through a simulation daemon running within the user space of the operating system in the storage system to the management daemon of the storage system when the management daemon of the storage system interacts with the one or more physical storage shelves in response to the request for the simulation test of the management and configuration task of the storage system, wherein the virtual shelf configuration information presents a plurality of virtual shelves based on the one or more physical disks within a single one of the physical storage shelves; and processing instructions through a simulation driver running within the kernel space of the operating system in the storage system to and from a disk driver running within the kernel space of the operating system of the storage system and the simulation driver interacting with the simulation daemon to simulate access to the virtual shelves for providing shelf configuration information to the management daemon, in response to the request for the simulation test of the management and configuration task of the storage system, without having to utilize additional physical storage shelves, the disk driver including a logical control plane driver representing a control plane of the storage system and a logical data plane driver representing a data plane of the storage system, wherein the logical control plane driver is for signaling and coordination between the storage system and the one or more physical storage shelves and the logical data plane driver is for storage data passing between the storage system and the one or more physical storage shelves, wherein the request for the simulation test is to test functionality of the control plane of the storage system without storing data to the physical disks via the data plane, wherein the virtual shelves are presented to the simulation daemon by the simulation driver to have a virtual storage capacity that is larger than a physical storage capacity of the physical disks of the physical shelves.

17. The non-transitory computer-readable storage medium of claim 16, wherein the virtual shelf configuration information simulates a plurality of virtual shelves based on a physical storage shelf.

18. The non-transitory computer-readable storage medium of claim 17, wherein a portion of the physical storage shelf is designated as a virtual shelf specified in the virtual shelf configuration information.

19. The non-transitory computer-readable storage medium of claim 16, wherein the virtual shelf configuration information simulates a virtual shelf with a larger storage space than a physical storage shelf the virtual shelf based on.

20. The non-transitory computer-readable storage medium of claim 16, wherein the virtual shelf configuration information simulates a first file within a virtual shelf based on a second file within a physical storage shelf, wherein the size of the first file is larger than the size of the second file.

21. The non-transitory computer-readable storage medium of claim 16, wherein a search path of the management daemon for a dynamic library is modified in response to the request for a simulation test so that the virtual shelf configuration information of the simulation daemon takes priority.

\* \* \* \* \*